United States Patent
Ho et al.

(10) Patent No.: US 6,754,951 B2
(45) Date of Patent: Jun. 29, 2004

(54) METHOD OF DRILLING A CIRCUIT SUBSTRATE

(75) Inventors: Sheng-Chun Ho, Kaohsiung (TW); Min-Liang Hsiao, Kaohsiung (TW)

(73) Assignees: Advanced Semiconductor Engineering Material, Inc., Kaohsiung (TW); Advanced Semiconductor Engineering, Inc., Kaohsiung (TW)

( * ) Notice: Subject to any disclaimer, the term of this patent is extended or adjusted under 35 U.S.C. 154(b) by 186 days.

(21) Appl. No.: 09/920,543

(22) Filed: Jul. 31, 2001

(65) Prior Publication Data

US 2002/0035785 A1 Mar. 28, 2002

(30) Foreign Application Priority Data

Sep. 22, 2000 (TW) .......................................... 89119563

(51) Int. Cl.$^7$ ................................................. H01K 3/10

(52) U.S. Cl. ............................................ 29/852; 216/65
(58) Field of Search ........................... 29/830, 846, 852; 216/17, 65; 438/690

(56) References Cited

U.S. PATENT DOCUMENTS 6,240,636 B1 * 6/2001 Asai et al. ..................... 29/830
6,413,868 B1 * 7/2002 Bartush et al. ............... 216/18

* cited by examiner

Primary Examiner—Gregory L. Huson
Assistant Examiner—Peter deVore
(74) Attorney, Agent, or Firm—J.C. Patents

(57) ABSTRACT

A method of drilling a circuit substrate. A circuit substrate including at least a core layer and a metal layer covering one or both surfaces of the core layer is provided. A half-etching process is performed by etching the metal layer on the circuit substrate with an etchant to reduce the thickness of the metal layer. A surface treatment on the surface of the metal layer A via is formed in the circuit substrate by laser.

10 Claims, 4 Drawing Sheets

METHOD OF DRILLING A CIRCUIT SUBSTRATE

BACKGROUND OF THE INVENTION

1. Field of the Invention

The present invention relates to a method of drilling a circuit substrate. More specifically, the present invention relates to a method of ablating an IC circuit substrate by laser.

2. Description of the related art

A laminated board is the substrate often used as a printed circuit board and an IC package substrate in current electronic-related industries. With the demand for increased integration of electronic products, the electronic products are designed to be smaller in size, lighter in weight and to have high performance. Accordingly, it is necessary to obtain a laminated board having an increased density, a decreased thickness, a reduced pitch between circuits and a smaller through hole.

FIGS. 1A to 1C are schematic, cross-sectional views of a conventional process of fabricating a circuit substrate are shown.

As shown in FIG. 1A, an inner substrate 104 having two circuit layers 102 is shown. The circuit layer 102 can be formed on both surfaces of an insulating layer 100 by photolithography and etching process.

As shown in FIG. 1B, an oxidation is carried out on the inner circuit layer 102 to form oxides thereon. That is, the surfaces of the inner circuit layer 102 are oxidized to make the surface thereof coarser, so that the adhesion of the inner circuit layer 102 to an insulator(s) is enhanced. Each side of the inner substrate 104 is provided with an adhesive 106 and a copper foil 108. Then, laminating is carried out for formation of another circuit layer in the subsequent step. It is noted that the adhesive 106 and the inner circuit layer 102 are bonded and cured before formation of another circuit layer in the subsequent step. However, the adhesive 106 and the inner circuit layer 102 are bonded only by pressing the adhesive 106 toward the inner circuit layer 102 with heating, which is known as thermal pressing, and by cooling while pressing, which is known as cool pressing.

As shown in FIG. 1C, a through hole or a guide hole 120, which is used for connection or installation, is formed at the position where a component is to be installed, and layers are communicated with each other, which is a step called drilling. After drilling, the insulating layer 100 becomes an insulating layer 110. After drilling, the inner circuit layer 102 becomes an inner circuit layer 112. After drilling, the copper foil 108 becomes copper foil 118. A plating through hole (PTH) is formed by plating the via 120 with copper to form a copper foil 122 in the via 120. The copper foils 118 and 122 are etched by using a mask to form an outer circuit layer. In the case of a four-layered laminate, a solder mask is applied on the outer circuit layer to expose the portions where other components are connected. Finally, a solder layer is formed on portions exposed from the solder mask on the outer circuit layer so as to protect the copper surface from being oxidized and increase the adhesion to the solder layer when soldering. Therefore, the portions having a solder mask applied will not be contaminated with the solder, and a short circuit can be thus avoided.

The formation of the via 120 can be achieved by drilling using drilling gimlets. However, the use of drilling gimlets has some disadvantages such as poor availability, high price, easily breakable, and difficulty in controlling the depth of the via. Drilling using punches always generates burrs. In the case of ablating using a $CO_2$ laser, the depth of ablating is limited due to the lower energy of the $CO_2$ laser. In the case of UV YAG laser ablating, the ablating speed is limited since a small beam size for the laser is used in the UV YAG laser ablating. In general, a positioning hole is first defined in the outer copper layer by photolithography and etching to expose part of the insulating layer. Then, the insulating layer exposed by the positioning hole is ablated through laser until the insulating layer is penetrated. If photolithography and etching are used in combination with laser ablating, then some disadvantages are generated, such as a complicated process, inconstant precision of forming a via, higher cost, and the difficult formation of a micro-via with a size that is less than 4 mil.

SUMMARY OF THE INVENTION

It is one object of the present invention to provide a method of ablating a circuit substrate to resolve problems such as limited speed of YAG laser ablating and to increase the alignment of the inner layer in a built-up process.

It is another object of the present invention to provide a method of ablating a circuit substrate. The process comprises at least providing a circuit substrate that at least includes a core layer and a metal layer covering one or both surfaces of the core layer. A half-etching process is carried out to etch the metal layer on the circuit substrate with an etchant to partly reduce the thickness of the metal layer. Then, the metal layer is subject to a surface treatment in order to increase the absorption of the laser. A via is formed in the circuit substrate by laser ablating.

According to one preferred example of the present invention, the core layer is formed by alternately superposing a plurality of insulating layers and a plurality of patterned circuit layers. In the method of drilling a circuit substrate according to the present invention, $CO_2$ laser ablating with high energy is used and the copper foil is subject to a surface treatment to increase the absorption of the laser. Accordingly, disadvantages in the prior art, such as limited depth in a conventional $CO_2$ laser ablating and limited speed in the conventional YAG laser ablating, can be prevented. Since the copper foil and the insulating layer are ablated directly in the method of the present invention, the process can be thus simplified. Meanwhile, the precision of forming a via is not affected by the expansion/contraction and exposure of the metal layers, thereby improving the alignment.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCIPTION OF THE PREFERRED EMBODIMENT

Figure 1A:
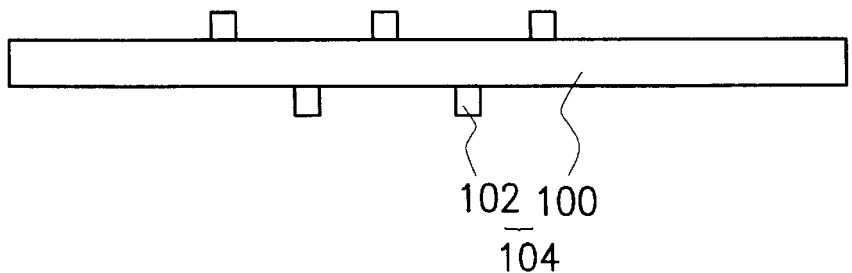
FIGS. 1A to 1C are schematic, cross-sectional views of a conventional process of fabricating a circuit substrate.
Figure 1B:
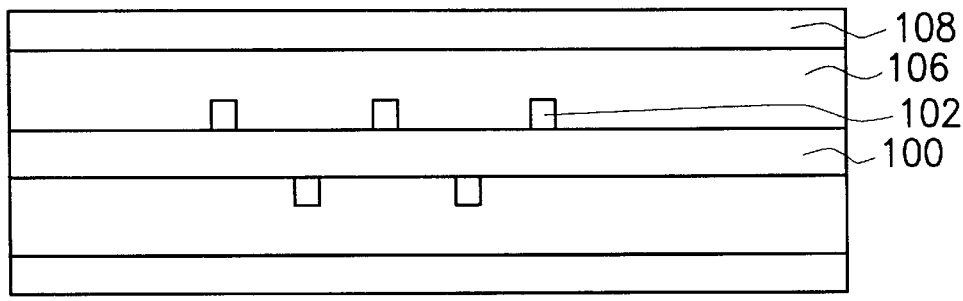
Figure 1C:
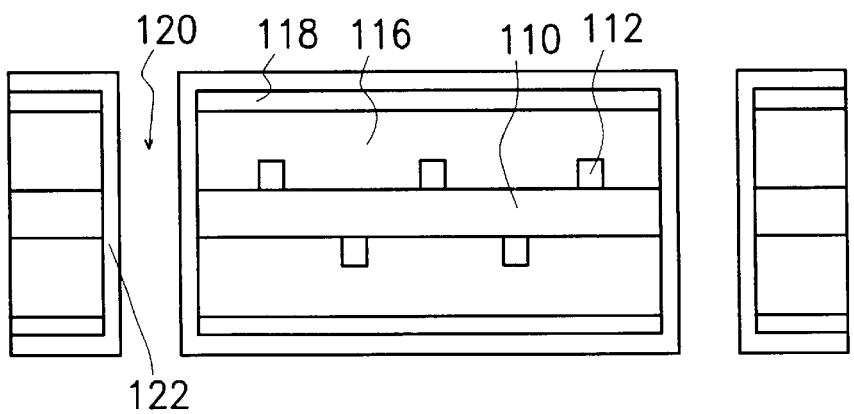
Figure 2A:
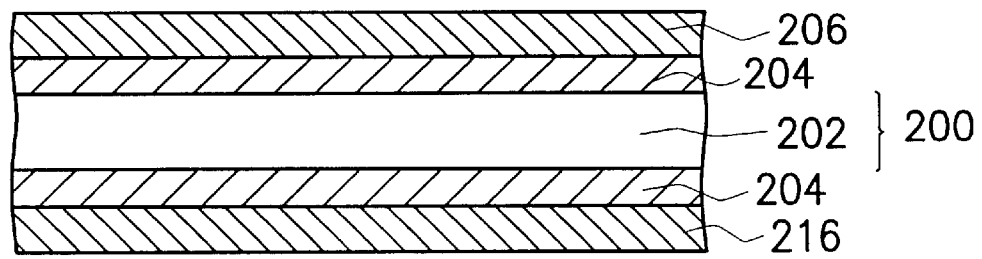
FIGS. 2A to 2C are schematic, cross-sectional views of a method of drilling a circuit substrate according to a first preferred example of the present invention.
Figure 2B:
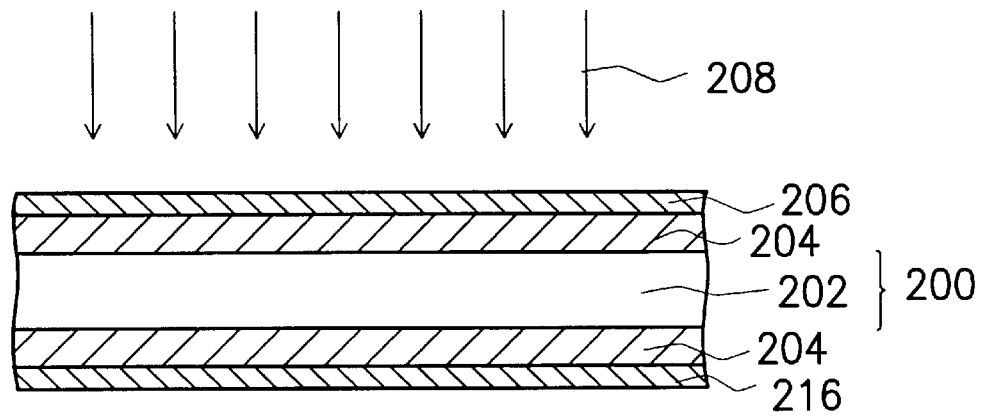
Figure 2C:
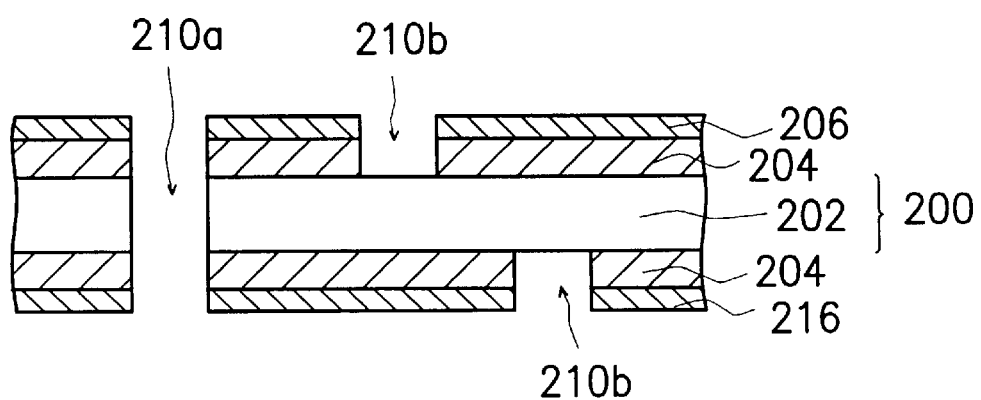

FIGS. 2A to 2C are schematic, cross-sectional views of a method of drilling a circuit substrate according to a first preferred embodiment of the present invention.

As shown in FIG. 2A, a circuit substrate 200 is provided. The circuit substrate 200 can be an integrated circuit package substrate or a printed circuit board, for example. The circuit substrate 200 at least includes a core layer 202, an insulating layer 204 and metal layers 206, 216. The core layer 202 can be formed by alternatively superposing insulating layers and patterned circuit layers. The metal layers 206, 216 are applied on the insulating layers 204 that are attached to surfaces of the core layer 202. The insulating layers 204 in the core layer 202 or on the surfaces of the core layer 202 can be a prepreg which is a hard resin having high glass transition temperature (Tg) such as glass epoxy resin, bismaleimide-triazine (BT) resin or epoxy resin, or can be a substrate commonly used in the art, such as FR-4 substrate, FR-5 substrate and BT substrate. The patterned circuit layer can be made of copper by using a photographic process, for example. The metal layers 206, 216 can be copper foils having a thickness of about 17 microns, for example.

As shown in FIG. 2B, a treating agent 208 is used to partly reduce the thickness of the metal layers 206, 216 on the circuit substrate 200 and to perform a surface treatment on the metal layers 206, 216. The treating agent 208 can be a combination of inorganic acids, such as a mixed solution of sulfuric acid ($H_2SO_4$) and hydrogen peroxide ($H_2O_2$) with the ratio of $H_2SO_4$:$H_2O_2$ being about 3:7–8:2. The thickness of the metal layer 206 is reduced because of the erosion caused by the treating agent 208. The treating agent 208 serves to impose surface treatment on the metal layers 206, 216. Crystalline Copper oxides are formed on the surface of the copper layer after the surface treatment to gloom the surface thereof, so that it can prevent laser from being scattered and increase the absorption to the laser. However, the surface of the copper layer also can be darkened in a black process, with needle-like crystals being easily destroyed during the process. As shown in FIG. 2C, vias 210a and 210b are formed in the circuit substrate 200 by laser ablating. The via 210a can be a through hole or a blind hole like the via 210b shown in FIG. 2C. The vias 210a and 210b are drilled by using a laser such as a gas laser or a solid laser. The gas laser can be a $CO_2$ laser or a yttrium-aluminum-garnet laser (YAG laser), for example. The wavelength of the $CO_2$ laser is about 10.6 microns and the beam size thereof is about 0.1 mm. The wavelength of the YAG laser is about 1.064 microns and the beam size thereof is about 0.05 mm. It is preferred to use a $CO_2$ laser with higher energy, about 10–15 mj/cm$^2$. In the embodiment of the present invention, the copper foil and the insulating layer are ablated directly by the $CO_2$ laser, without need of any positioning hole that normally must be formed by photolithography in a conventional drilling process. The precision for forming the vias 210a and 210b is not affected by the expansion/contraction and exposure of the metal layers 206 and 216. Moreover, the vias to be formed are directly aligned, so alignment ability during the process is enhanced. In one preferred embodiment of the present invention, the $CO_2$ laser has twice the energy as the conventional one, and the metal layers 206, 216 are subject to the surface treatment to increase the absorption of the laser. Thus, problems arising from the speed and depth limitations of laser ablating can be improved. After laser ablating, a step of thinning out the metal layers 206 and 216 can be further performed by using inorganic acids or sulfuric acid-based etchant liquids having 20%–80% sulfuric acid. This not only thins out the metal layers 206 and 216, but also removes burrs generated during laser ablating. The metal layer thinning process set forth above is optionally performed as desired.

FIGS. 3A to 3D are schematic, cross-sectional views of a method of drilling a circuit substrate according to a second preferred embodiment of the present invention.

Figure 3A:
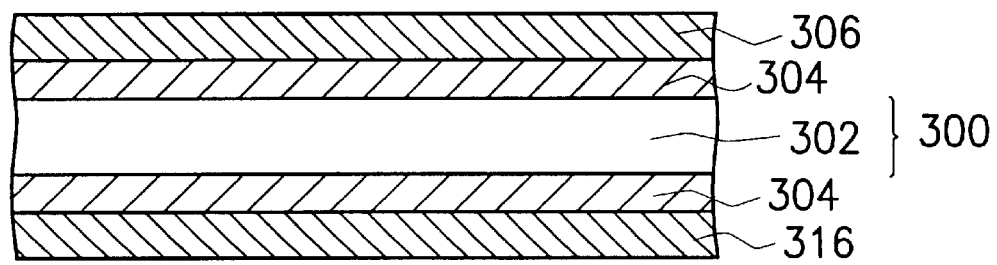
FIGS. 3A to 3D are schematic, cross-sectional views of a method of drilling a circuit substrate according to a second preferred example of the present invention.

As shown in FIG. 3A, a circuit substrate 300 is provided. The circuit substrate 300 is an integrated circuit package substrate or a printed circuit board, for example. The circuit substrate 300 at least includes a core layer 302, an insulating layer 304 and metal layers 306, 316. The core layer 302 can include insulating layers and patterned circuit layers, which are alternately superposed. The metal layers 306, 316 are applied on the insulating layers 304, which are attached to surfaces of the core layer 302. The insulating layers 304 in the core layer 302 or on the surfaces of the core layer 302 can be a prepreg that is a hard resin having high glass transition temperature (Tg) such as glass epoxy resin, bismaleimide-triazine (BT) resin or epoxy resin, or can be a substrate which is commonly used in the art, such as an FR-4 substrate, FR-5 substrate and BT substrate. The patterned circuit layer can be made of copper by using a photographic process, for example. The metal layers 306, 316 can be copper foil having a thickness of about 17 microns, for example.

Figure 3B:
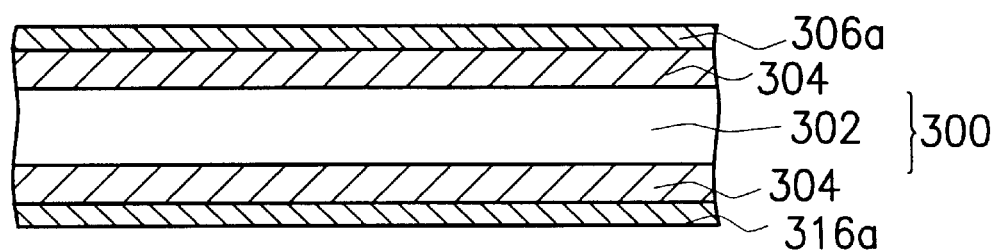
Figure 3C:
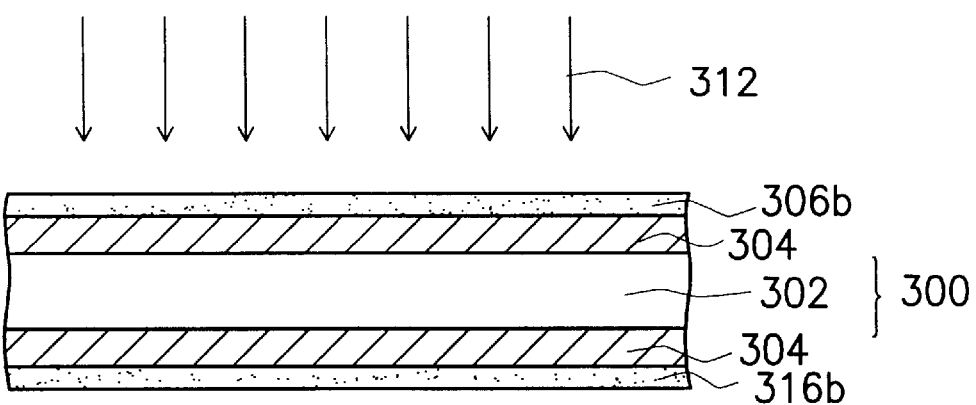

As shown in FIG. 3B, a half-etching is carried out by using an etchant liquid 308, which is used to partly reduce the thickness of the metal layers 306, 316 on the circuit substrate 300 (half-etching step). The etchant liquid 308 can be a combination of inorganic acids, such as a mixed solution of sulfuric acid ($H_2SO_4$) and hydrogen peroxide ($H_2O_2$) with 20%–80% $H_2SO_4$ and 80%–20% $H_2O_2$. The etched metal layer 306a and 316a have thickness of about 5 micron. As shown in FIG. 3C, the metal layers 306b and 316b are subject to a surface treatment 312 such as a brown process or a black process. The surface treatment can be carried out by using a mixed solution of sulfuric acid ($H_2SO_4$) and hydrogen peroxide ($H_2O_2$) with the ratio of $H_2SO_4$:$H_2O_2$ being 3:7–8:2 so as to increase the absorption of laser in the metal layers 306a and 316a.

Figure 3D:
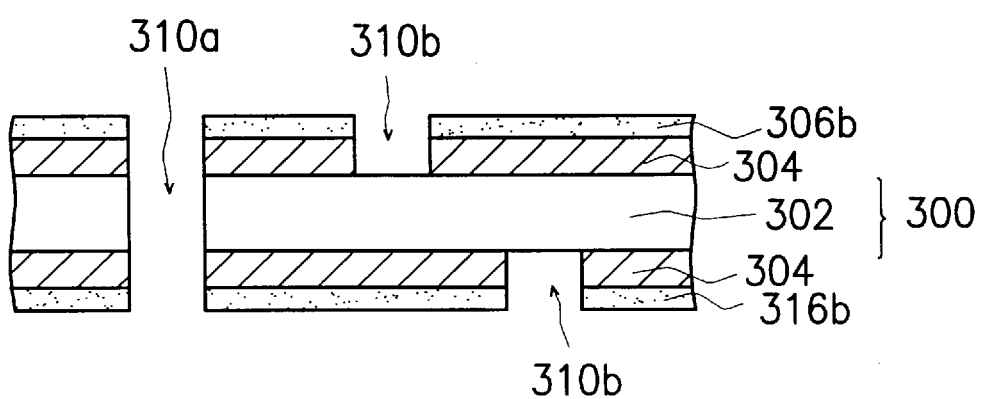

As shown in FIG. 3D, vias 310a and 310b are formed in the circuit substrate 300 by laser ablating. The via 310a can be a through hole or a blind hole like the via 310b shown in FIG. 3D. The vias 310a and 310b are drilled by using a laser such as a gas laser or a solid laser. The gas laser can be a $CO_2$ laser or a yttrium-aluminum-garnet laser (YAG laser), for example. The wavelength of the $CO_2$ laser is about 10.6 micron and the beam size thereof is about 0.1 mm. The wavelength of the YAG laser is about 1.064 micron and the beam size thereof is about 0.05 mm. It is preferred to use a $CO_2$ laser with higher energy, about 10–15 mj/cm$^2$. In the embodiment of the present invention, the copper foil and the insulating layer are ablated by the $CO_2$ laser, without need of any positioning hole that normally must be formed by photolithography in a conventional drilling process. The precision of forming the vias 310a and 310b would not be affected by the expansion/contraction and exposure of the metal layers 306 and 316. Moreover, the vias to be formed can be directly aligned, so the alignment ability during the process is enhanced. In one preferred embodiment of the present invention, a $CO_2$ laser with twice the energy as a conventional one is used and the surfaces of the metal layers 306, 316 are subject to the surface treatment to increase the absorption of laser, so problems from speed and depth limitations to laser ablating can be eliminated. Further, in the metal layer thinning step (after laser ablating) of the first embodiment or in the half-etching step (before laser ablating) of the second embodiment, the undercut generated when defining metal layers by photolithography can be eliminated in order to make the profile of the circuit more smooth. Because the profile of the circuit is more smooth, subsequent steps, such as the laminating or defining process and coating of the solder mask, can be better facilitated.

From a view of the foregoing, the present invention has the advantages as follows:

1. Because of the laser ablating with a high energy $CO_2$ laser combined with a surface treatment of the metal layers and an optional metal layer thinning process, the limitations of the ablating speed of the YAG laser can be improved.
2. Because the surfaces of the metal layers are subject to the surface treatment to increase the absorption of laser, the drilling on the copper foil and the insulating layer can be performed by a $CO_2$ laser without any positioning hole that is normally formed by photolithography. The process can be thus simplified.
3. Since the copper foil and the insulating layer are ablated directly, the precision of forming the via is not affected by the expansion/contraction and exposure of the metal layers.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A method of drilling a circuit substrate, comprising at least the following steps:

providing a circuit substrate including at least a core layer and a metal layer covering one or both surfaces of the core layer;

using a treating agent to reduce the thickness of the metal layer on the circuit substrate;

carrying out a surface treatment on the metal layer, wherein the surface treatment is performed by using a mixed solution of sulfuric acid ($H_2SO_4$) and hydrogen peroxide ($H_2O_2$) with a ratio of $H_2SO_4$:$H_2O_2$ being about 3:7 to 8:2; and forming a via in the circuit substrate by laser ablating, wherein the laser energy is about 10 to 15 mj/cm$^2$.

2. The method of drilling a circuit substrate of claim 1, wherein the core layer comprises a plurality of patterned circuit layers and a plurality of insulating layers which are superposed on each other, and one of these insulating layers is located on the surface of the core layer and attached to the metal layer.

3. The method of drilling a circuit substrate of claim 1, wherein the treating agent is a mixed solution mainly consisting of sulfuric acid and hydrogen peroxide.

4. The method of drilling a circuit substrate of claim 1, further comprising a metal layer thinning step for reducing the thickness of the metal layer after the laser ablating.

5. The method of drilling a circuit substrate of claim 4, wherein the metal layer thinning step is carried out by etching the metal layer with an inorganic acid.

6. The method of drilling a circuit substrate of claim 4, wherein the metal layer thinning step is carried out by etching the metal layer with an inorganic acid that contains 20%–80% sulfuric acid.

7. The method of drilling a circuit substrate of claim 1, wherein the laser used for drilling is a $CO_2$ laser with an energy of 10–15 mj/cm$^2$.

8. The method of drilling a circuit substrate of claim 1, wherein the via is a through hole that penetrates the metal layer and the core layer.

9. The method of drilling a circuit substrate of claim 1, wherein the via is a blind hole that penetrates the metal layer and part of the core layer.

10. The method of drilling a circuit substrate of claim 1, wherein the treating agent is an inorganic acid containing 20%–80% sulfuric acid.

* * * * *